United States Patent
Sugamori et al.

(10) Patent No.: US 6,629,282 B1
(45) Date of Patent: Sep. 30, 2003

(54) MODULE BASED FLEXIBLE SEMICONDUCTOR TEST SYSTEM

(75) Inventors: Shigeru Sugamori, Santa Clara, CA (US); Rochit Rajsuman, Santa Clara, CA (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/434,821

(22) Filed: Nov. 5, 1999

(51) Int. Cl.[7] .................. G01R 31/28; G01R 31/04; G01R 31/02; G06F 11/00; G11C 29/00

(52) U.S. Cl. .................. 714/734; 714/738; 324/754; 324/761; 365/201

(58) Field of Search ................ 714/724, 734, 714/738; 324/754, 761; 365/201

(56) References Cited

U.S. PATENT DOCUMENTS

| | | | | |
|---|---|---|---|---|
| 5,025,205 A | * | 6/1991 | Mydill et al. | 324/73.1 |
| 5,216,361 A | * | 6/1993 | Akar et al. | 324/761 |
| 5,254,939 A | * | 10/1993 | Anderson et al. | 324/754 |
| 6,018,814 A | * | 1/2000 | Rockoff | 714/724 |
| 6,314,034 B1 | * | 11/2001 | Sugamori | 365/201 |
| 6,331,770 B1 | * | 12/2001 | Sugamori | 324/158.1 |
| 6,360,340 B1 | * | 3/2002 | Brown et al. | 714/718 |

* cited by examiner

Primary Examiner—Albert Decady
Assistant Examiner—Cynthia Britt
(74) Attorney, Agent, or Firm—Muramatsu & Associates

(57) ABSTRACT

A semiconductor test system for testing semiconductor devices, and particularly, to a semiconductor test system having a plurality of different types of tester modules for easily establishing different semiconductor test systems. The semiconductor test system includes two or more tester modules whose performances are different from one another, a test head to accommodate the two or more tester modules having different performances, means provided on the test head for electrically connecting the tester modules and a device under test, and a host computer for controlling an overall operation of the test system by communicating with the tester modules through a tester bus. One type of the performances of the tester module is high speed high timing accuracy while other type of performance is low speed low timing accuracy. Each event tester module includes a tester board which is configured as an event based tester.

14 Claims, 8 Drawing Sheets

MODULE BASED FLEXIBLE SEMICONDUCTOR TEST SYSTEM

FIELD OF THE INVENTION

This invention relates to a semiconductor test system for testing semiconductor integrated circuits such as a large scale integrated (LSI) circuit, and more particularly, to a module based semiconductor test system which accommodates a combination of different types of test apparatuses of modular structure so as to easily create a desired type of semiconductor test system. Further, in the semiconductor test system of the present invention, a small number of high speed high performance test apparatuses (tester modules) and a large number low speed low performance test apparatuses (tester modules) are freely combined, thereby establishing a low cost test system. In the semiconductor test system of the present invention, the tester module and a tester board used in the tester module are configured as an event based tester to generate event based test patterns for testing a semiconductor integrated circuit.

BACKGROUND OF THE INVENTION

FIG. 1 is a schematic block diagram showing an example of a semiconductor test system in the conventional technology for testing a semiconductor integrated circuit (hereafter may also be referred to as "IC device", "LSI under test" or "device under test").

In the example of FIG. 1, a test processor 11 is a dedicated processor provided within the semiconductor test system for controlling the operation of the test system through a tester bus. Based on pattern data from the test processor 11, a pattern generator 12 provides timing data and waveform data to a timing generator 13 and a wave formatter 14, respectively. A test pattern is produced by the wave formatter 14 with use of the waveform data from the pattern generator 12 and the timing data from the timing generator 13, and the test pattern is supplied to a device under test (DUT) 19 through a driver 15.

A response signal from the DUT 19 resulted from the test pattern is converted to a logic signal by an analog comparator 16 with reference to a predetermined threshold voltage level. The logic signal is compared with expected value data from the pattern generator 12 by a logic comparator 17. The result of the logic comparison is stored in a failure memory 18 corresponding to the address of the DUT 19. The driver 15, the analog comparator 16 and switches (not shown) for changing pins of the device under test, are provided in a pin electronics 20.

The circuit configuration noted above is provided to each test pin of the semiconductor test system. Therefore, since a large scale semiconductor test system has a large number of test pins, such as from 256 to 1048 test pins, and the same number of circuit configurations, each being shown in FIG. 1 are incorporated, an actual semiconductor test system becomes a very large system. FIG. 2 shows an example of outer appearance of such a semiconductor test system. The semiconductor test system is basically formed with a main frame 22, a test head 24, and a work station 26.

The work station 26 is a computer provided with, for example, a graphic user interface (GUI) to function as an interface between the test system and a user. Operations of the test system, creation of test programs, and execution of the test programs are conducted through the work station 26. The main frame 22 includes a large number of test channels each having the test processor 11, pattern generator 12, timing generator 13, wave formatter 14 and comparator 17 shown in FIG. 1 corresponding to the test pins.

The test head 24 includes a large number of printed circuit boards each having the pin electronics 20 shown in FIG. 1. The test head 24 has, for example, a cylindrical shape in which the printed circuit boards forming the pin electronics are radially aligned. On an upper surface of the test head 24, a device under test 19 is inserted in a test socket at about the center of a performance board 28.

Between the pin electronics circuit and the performance board 28, a pin (test) fixture 27 is provided which is a contact mechanism for communication of electrical signals. The pin fixture 27 includes a large number of contactors such as pogo-pins for electrically connecting the pin electronics circuits and the performance board. The device under test 19 receives a test pattern signal from the pin electronics and produces a response output signal.

In the conventional semiconductor test system, for producing a test pattern to be applied to a device under test, the test data which is described in, what is called a cycle based format, has been used. In the cycle based format, each variable in the test pattern is defined relative to each test cycle (tester rate) of the semiconductor test system. More specifically, test cycle (tester rate) descriptions, waveform (kinds of waveform and edge timings) descriptions, and vector descriptions in the test data specify the test pattern in a particular test cycle.

In the design stage of the device under test, under a computer aided design (CAD) environment, the resultant design data is evaluated by performing a logic simulation process through a test bench. However, the design evaluation data thus obtained through the test bench is described in an event based format. In the event based format, each change point (event) in a particular test pattern, such as from "0" to "1" or from "1" to "0", is described with reference to a time passage. The time passage is expressed by, for example, an absolute time length from a predetermined reference point or a relative time length between two adjacent events.

The inventors of this invention have disclosed the comparison between the test pattern formation using the test data in the cycle based format and the test pattern formation using the test data in the event based format in the U.S. patent application Ser. No. 09/340,371. The inventors of this invention have also proposed an event based test system as a semiconductor test system as a new concept test system. The details of the structure and operation of the event based test system is given in the U.S. patent application Ser. No. 09/406,300, now U.S. Pat. No. 6,532,561 owned by the same assignee of this invention.

As described in the foregoing, in the semiconductor test system, a large number of printed circuit boards and the like which is equal to or greater than the number of the test pins are provided, resulting in a very large system as a whole. In the conventional semiconductor test system, the printed circuit boards and the like are identical to one another.

For example, in a high speed and high resolution test system, such as a test rate of 500 MHz and timing accuracy of 80 picosecond, the printed circuit boards for all the test pins have the same capabilities, each being able to satisfy the test rate and timing accuracy. Thus, the conventional semiconductor test system inevitably becomes a high cost system. Further, since the identical circuit structure is used in each test pin, the test system can conduct only limited types of test.

However, in an actual device under test, almost always, not all of the pins of such a device under test require the highest performance of the semiconductor test system. For example, in a typical logic LSI device to be tested having several hundred pins, only several pins actually operate at the highest speed and thus require the highest speed test signal while other several hundred pins operate at substantially lower speeds and thus low speed test signals are sufficient to these pins. This is also true to a system-on-a-chip (SoC), a recent semiconductor device which draws high attention in the industry. Thus, high speed test signals are needed to only a small number of pins of an SoC while low speed test signals are sufficient for other pins.

In the conventional semiconductor test system, the high test performance which is needed only for a small number of pins of the device under test is equipped to all of the test pins, resulting in the cost increase of the test system. Further, because the conventional semiconductor test system includes the circuits of the same structure and performance for all of the test pins, it is not possible to conduct different types of test in parallel at the same time.

One of the reasons that the conventional semiconductor test system installs the identical circuit configuration in all of the test pins as noted above, and as a result, it is not able to conduct two or more different kinds of test at the same time, is that the test system is configured to generate the test pattern by using the cycle based test data. In producing the test pattern using the cycle based concept, the software and hardware tend to be complicated. Thus, it is practically impossible to include different circuit configurations and software associated with different circuits in the test system, because doing so would make the test system even more complicated.

To explain the reason, brief comparison is made between the test pattern formation using the test data in the cycle based format and the test pattern formation using the test data in the event based format with reference to waveforms shown in FIG. 3. The more detailed comparison is disclosed in the above noted U.S. patent applications owned by the same assignee of this invention.

The example of FIG. 3 shows the case where a test pattern is created based on the data resulted from the logic simulation conducted in the design stage of the integrated circuit and stored in a dump file 37. The output of the dump file is data in the event based format showing the changes in the input and output of the designed LSI device and having descriptions 48 shown in the lower right of FIG. 3 for expressing, for example, the waveforms 41.

In this example, it is assumed that test patterns such as shown by the waveforms 41 are to be formed by using such descriptions. The waveforms 41 illustrate test patterns to be generated for pins (tester pins or test channels) Sa and Sb, respectively. The event data describing the waveforms is formed of set edges San, Sbn and their timings (for example, time lengths from a reference point), and reset edges Ran, Rbn and their timings.

For producing a test pattern to be used in the conventional semiconductor test system based on the cycle based concept, the test data must be divided into test cycles (tester rate), waveforms (types of waveforms, and their edge timings), and vectors. An example of such descriptions is shown in the center and left of FIG. 3. In the cycle based test pattern, as shown by waveforms 43 in the left part of FIG. 3, a test pattern is divided into each test cycle (TS1, TS2 and TS3) to define the waveforms and timings (delay time) for each test cycle.

An example of data descriptions for such waveforms, timings and test cycles is shown in timing data (test plan) 46.

An example of logic "1", "0" or "Z" of the waveforms is shown in vector data (pattern data) 45. For example, in the timing data 46, the test cycle is described by "rate" to define time intervals between test cycles, and the waveform is described by RZ (return to zero), NRZ (non-return to zero) and XOR (exclusive OR). Further, the timing of each waveform is defined by a delay time from a predetermined edge of the corresponding test cycle.

As in the foregoing, because the conventional semiconductor test system produces a test pattern under the cycle based procedure, the hardware structures in the pattern generator, timing generator, and wave formatter tend to be complicated, and accordingly, the software to be used in such hardware becomes complicated as well. Further, since all of the test pins (such as Sa and Sb in the above example) are defined by the common test cycle, it is not possible to generate test patterns of different cycles among the test pins at the same time.

Therefore, in the conventional semiconductor test system, the same circuit configurations are used in all of the test pins, and it is not possible to incorporate printed circuit boards of different circuit structures therein. As a consequence, for example, a high speed test system also needs to include a low speed hardware configuration (such as high voltage and large amplitude generation circuit and a driver inhibit circuit, etc.), the high speed performance cannot be fully improved in such a test system.

In contrast, for producing a test pattern by using the event based method, it is only necessary to read set/reset data and associated timing data stored in an event memory, requiring very simple hardware and software structures. Further, each test pin can operate independently as to whether there is any event therein rather than the test cycle, thus, test patterns of different functions and frequency ranges can be generated at the same time.

As noted in the foregoing, the inventors of this invention have proposed the event based semiconductor test system. In the event based test system, since the hardware and software involved are very simple in the structure and contents, it is possible to formulate an overall test system having different hardware and software therein. Moreover, since each test pin can operate independently from the other, two or more tests which are different in functions and frequency ranges from one another can be carried out in a parallel fashion at the same time.

SUMMARY OF THE INVENTION

Therefore, it is an object of the present invention to provide a semiconductor test system which has tester modules of different capabilities corresponding to test pins.

It is another object of the present invention to provide a semiconductor test system in which tester modules of different pin numbers and capabilities can freely installed in a tester main frame (or test head) by standardizing specification for connection between the tester modules and the tester main frame.

It is a further object of the present invention to provide a semiconductor test system which can freely accommodate high speed tester modules and low speed tester modules, thereby being able to perform a test sufficient to a device under test with substantially low cost.

It is a further object of the present invention to provide a semiconductor test system having a test head in which high speed tester modules (tester boards) and low speed tester modules (tester boards) are positioned differently in the test head depending on the operating speed of the tester modules.

It is a further object of the present invention to provide a semiconductor test system which is capable of testing a device under test which is a system-on-a-chip having a plurality of different functional cores therein with high test efficiency with low test cost.

The semiconductor test system of the present invention includes two or more tester modules whose performances are different from one another, a test head to accommodate the two or more tester modules having different performances, means provided on the test head for electrically connecting the tester modules and a device under test, and a host computer for controlling an overall operation of the test system by communicating with the tester modules through a tester bus. One type of the performances of the tester module is high speed high timing accuracy while other type of performance is low speed low timing accuracy.

In the semiconductor test system of the present invention, each of the tester modules includes a plurality of event tester boards. Under the control of the host computer, each tester board provides a test pattern to a corresponding pin of the device under test and evaluates a resultant output signal from the device under test.

In another aspect of the present invention, within the test head, the high speed high accuracy tester modules or tester boards are positioned closer to a test fixture and a performance board than the low speed low accuracy tester modules or tester boards.

In the first aspect of the present invention, since the semiconductor test system of the present invention has a modular structure, a desired test system can be formed freely depending on the kind of device to be tested and the purpose of the test. In the case where the device under test is a high speed logic IC, only a small portion of the logic circuits therein are actually operating in the high speed. Thus, for testing such a high speed logic IC, a small number of tester pins have to perform high speed test. In the semiconductor test system of the present invention, the specification for connecting the test head and tester modules (interface) is standardized. Accordingly, any tester modules having the standard interface can be installed at any positions in the test head. Thus, in the present invention, by combining a large number of low speed tester modules with a small number of high speed tester modules, a high speed device can be tested with low cost.

In the second aspect of the present invention, the positions for mounting the tester modules or boards in the system are determined depending on the operating speeds as noted above. For example, the high speed high accuracy tester modules or tester boards are positioned closer to the device under test (thus, the test fixture and the performance board) than the low speed low accuracy tester modules or tester boards. In the second aspect of the present invention, unlike the first aspect thereof where the tester modules are freely combined in the system, the positions of the tester boards cannot be freely changed. However, in the second aspect of the present invention, a test system of desired performance can be created with low cost.

As noted above, in the semiconductor test system of the present invention, the tester module (tester board) is configured by event based architecture where all the information required for executing the test is prepared in the event based format. Therefore, the rate signal showing the start timing of each test cycle or the pattern generator which operates in synchronism with the rate signal used in the conventional technology, are no longer necessary. Because it is not necessary to include the rate signal or pattern generator, each test pin in the event based test system can operate independently from the other test pins. Further, because of the event based architecture, the hardware of the event based test system can be dramatically reduced while the software for controlling the tester modules can be dramatically simplified. Accordingly, an overall physical size of the event based test system can be reduced, resulting in further cost reduction, floor space reduction and associated cost savings.

Further in the semiconductor test system of the present invention, the logic simulation data in the design stage of the device in the electronic design automation (EDA) environment can be directly used to produce the test pattern to test the device in the evaluation stage. Thus, a turnaround time between the design of the device and the evaluation of the device can be substantially decreased, thereby further decreasing the test cost while increasing the test efficiency.

DETAILED DESCRIPTION OF THE PREFERRED EMBODIMENT

Figure 4:
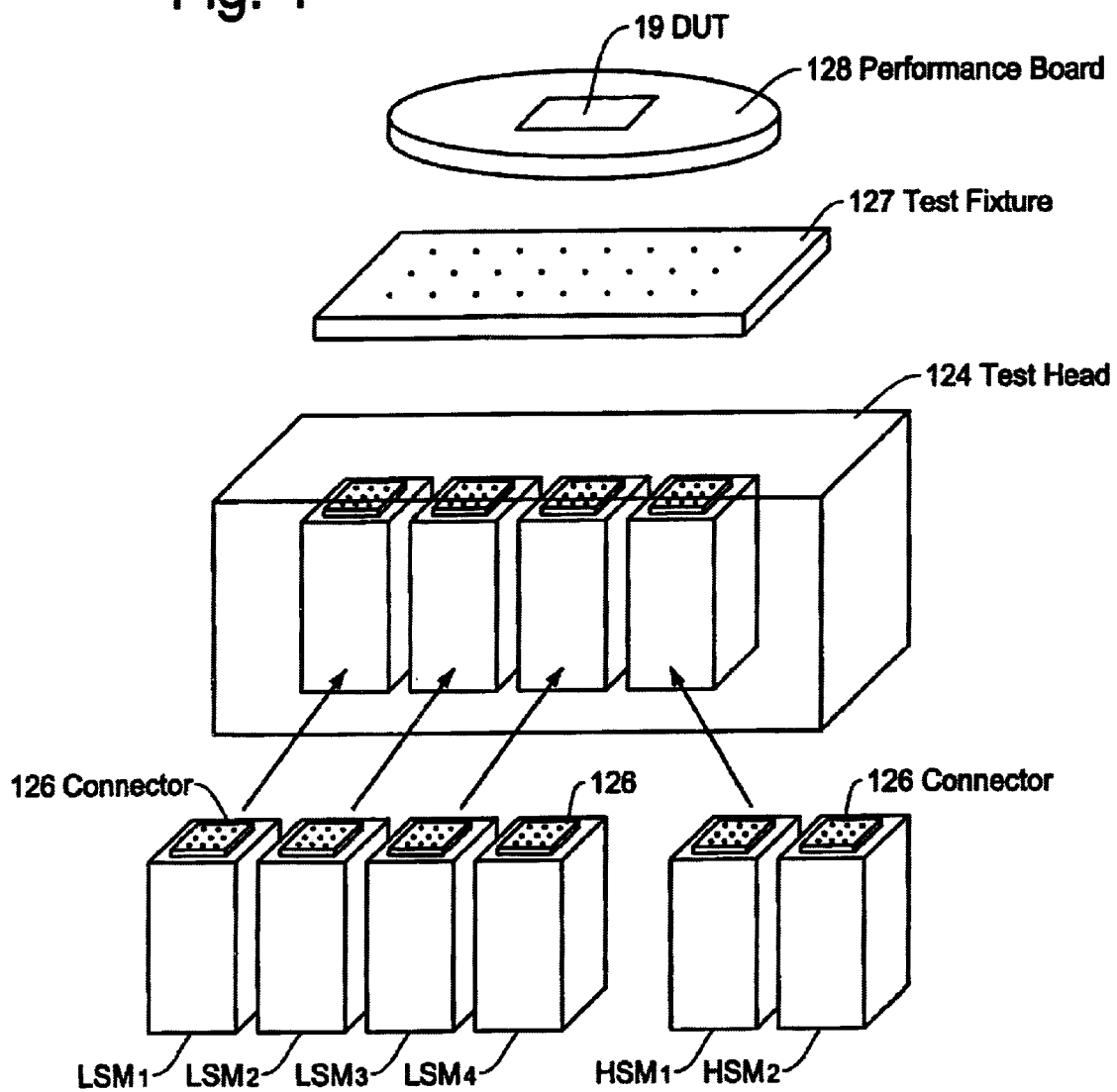
FIG. 4 is a schematic diagram for establishing a semiconductor test system having test pins grouped into different performances by incorporating a plurality of tester modules of the present invention.

The embodiment of the present invention is explained with reference to FIGS. 4–8. FIG. 4 is a schematic diagram showing a first aspect of the present invention. In the semiconductor test system of the present invention, a test head (tester main frame) is so configured that one or more modular testers (hereinafter "tester module") are selectively and freely installed therein. The tester modules to be installed can be a plurality of same tester modules depending on the number of tester pins desired or a combination of different tester modules such as high speed module HSM and low speed module LSM.

A test head 124 is provided with a plurality of tester modules depending on, for example, the number of pins of a test fixture 127, a type of the device to be tested, and the number of pins of the device to be tested. As will be described later, an interface (connection) specification between the test fixture and the test module is standardized so that any tester modules can be installed in any positions in the test head.

The test fixture 127 includes a large number of elastic connectors such as pogo-pins to electrically and mechanically connect the tester modules and a performance board 128. The device under test 19 is inserted in a test socket on the performance board 128, thereby establishing an electrical communication with the semiconductor test system.

Each of the tester modules has a predetermined number of pin groups. For example, one high speed module HSM installs printed circuit boards corresponding to 128 test pins (test channels) while one low speed module LSM installs printed circuit boards corresponding to 256 test pins. These numbers are disclosed only for an exemplary purpose, and various other numbers of test pins are also possible.

The high speed tester module is a tester module having a high operating speed such as a test rate of 500 MHz or 1.2 GHz and high timing accuracy such as 80 picosecond. The low speed test module is a tester module having a low operating speed such as a test rate of 125 MHz and timing accuracy of 200 picosecond.

As noted above, each board in the tester module has event testers where each event tester generates and applies test patterns to the corresponding pin of the device under test through the performance board 128. Output signals of the device under test 19 responsive to the test pattern are transmitted to the event tester board in the tester module through the performance board 128 whereby being compared with the expected signals to determine the pass/fail of the device under test.

Each tester module is provided with an interface (connector) 126. The connector 126 is so arranged to fit to the standard specification of the test fixture 127. For example, in the standard specification of the test fixture 127, a structure of connector pins, impedance of the pins, distance between the pins (pin pitch), and relative positions of the pins are specified for the intended test head. By using the interface (connector) 126 which matches the standard specification on all of the tester modules, test systems of various combinations of the tester modules can be freely established.

Because of the configuration of the present invention, a test system of optimum cost/performance which matches the device to be tested can be established. Further, improvement of the performance of the test system can be achieved by replacing one or more test modules, thus, an overall life time of the test system can be increased. Moreover, the test system of the present invention can accommodate a plurality of test modules whose performances are different from the other, and thus, the desired performance of the test system can be achieve directly by the corresponding test module. Therefore, the performance of the test system can be easily and directly improved.

Figure 5:
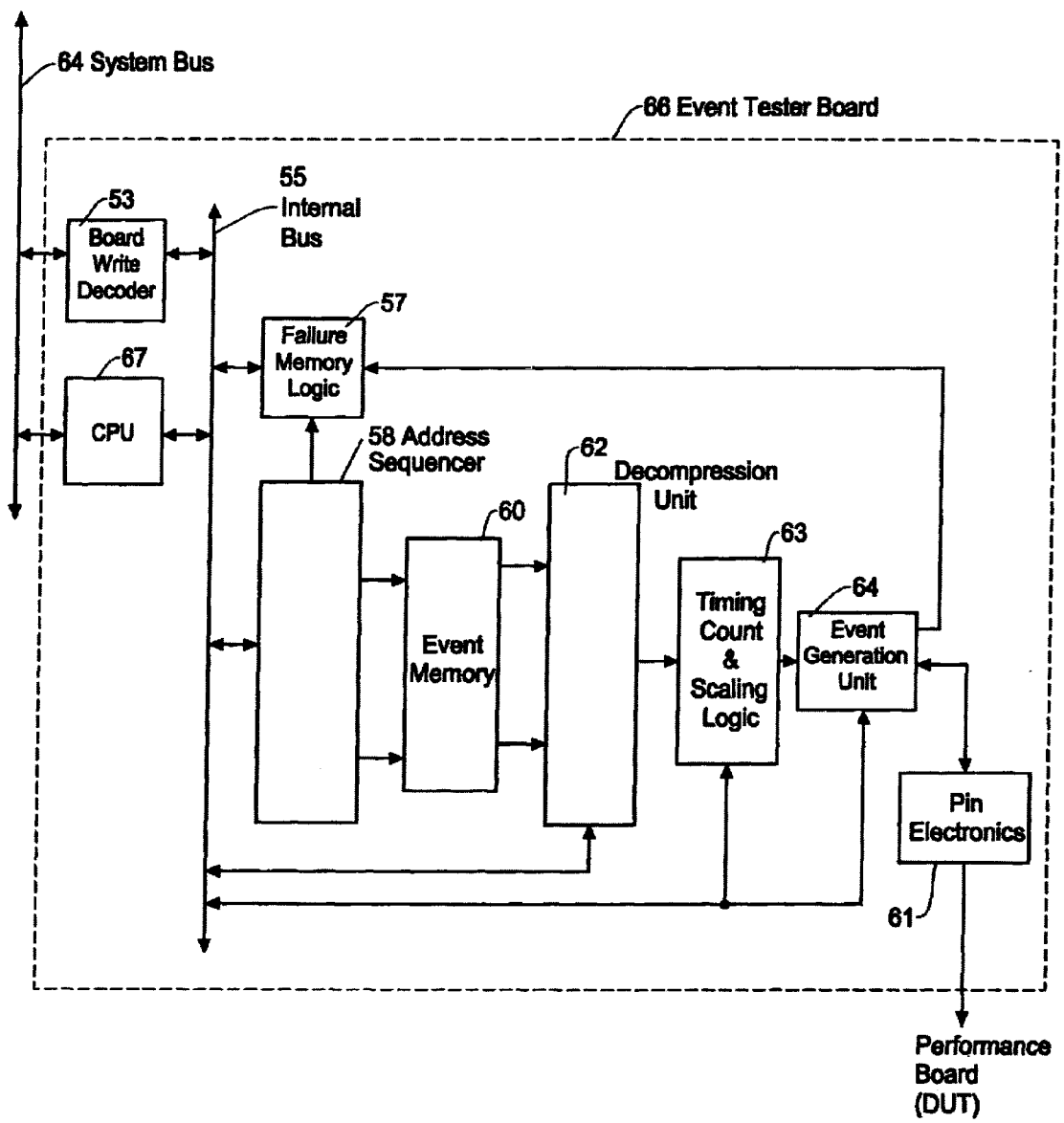
FIG. 5 is a block diagram showing an example of circuit configuration in an event tester provided in an event tester board which is incorporated in a tester module in accordance with the present invention.
Figure 6:
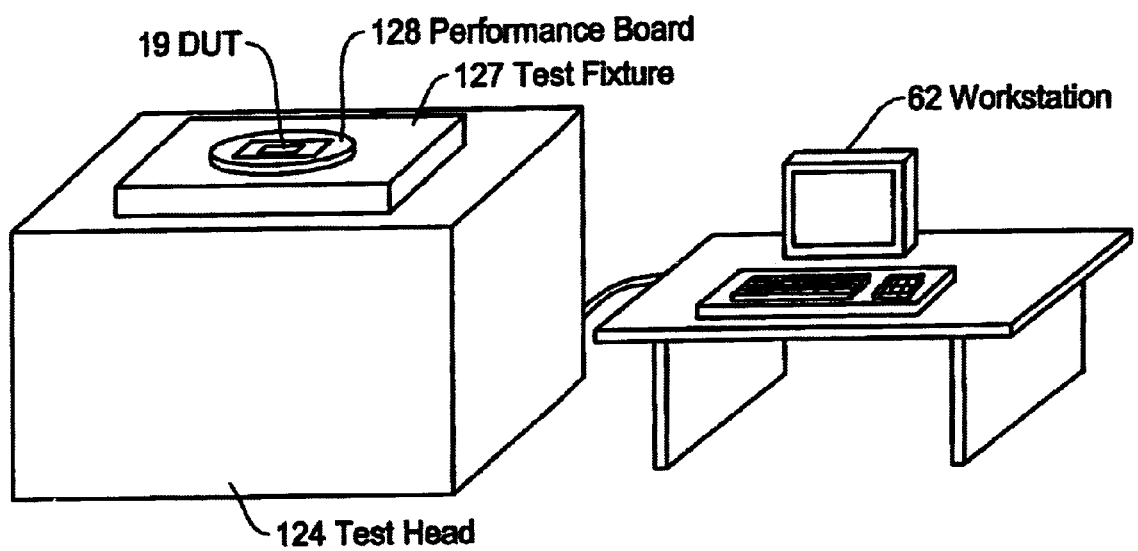
FIG. 6 is a schematic diagram showing an example of outward appearance of the semiconductor test system of the present invention.
Figure 7:
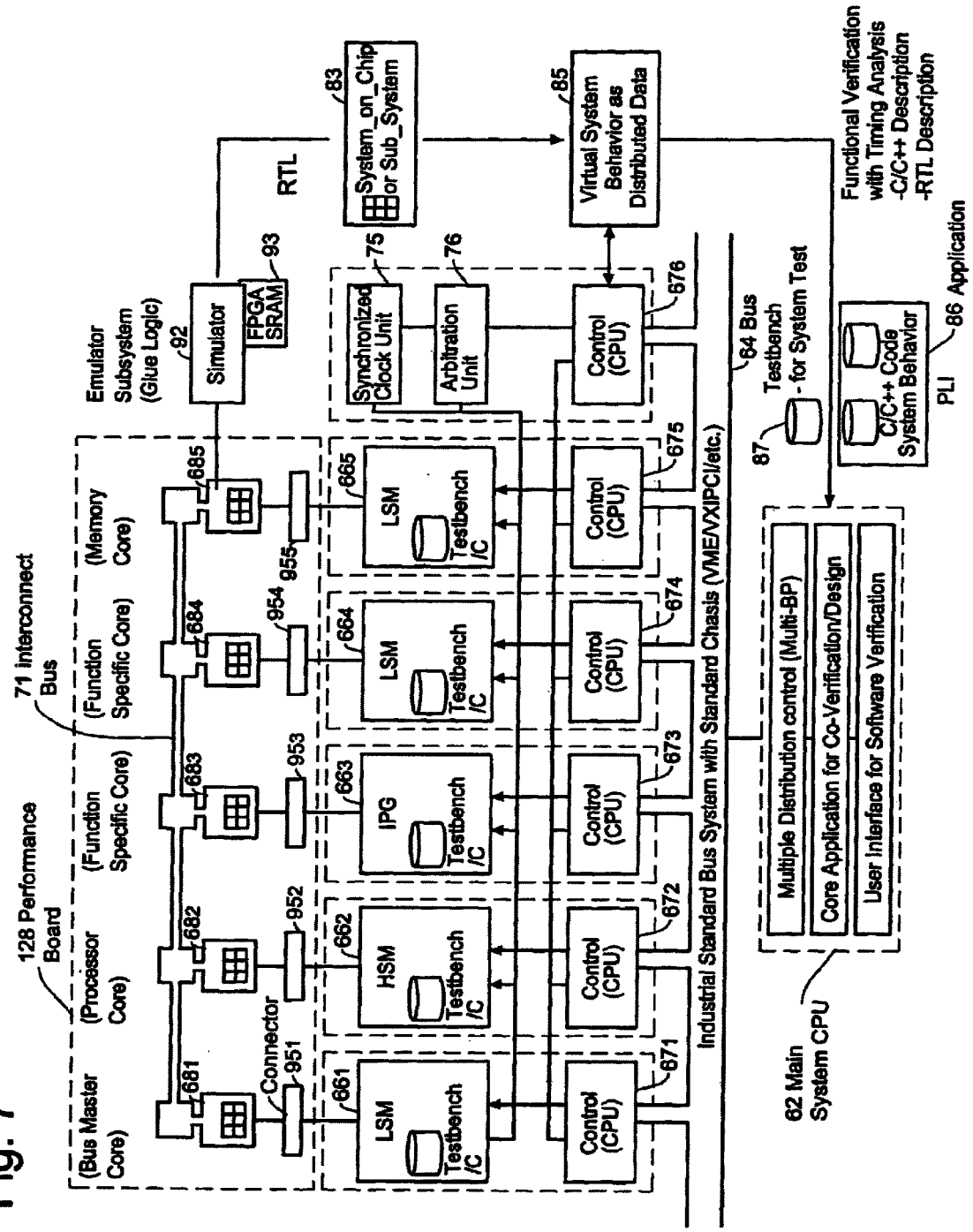
FIG. 7 is a block diagram showing an example of structure of a semiconductor test system suitable for testing a device under test such as a system-on-a-chip by combining a plurality of tester modules (tester boards) of different test speeds configured by the event based architecture in the present invention.

An example of outer appearance of the semiconductor test system of the present invention is shown in the schematic diagram of FIG. 6. In FIG. 6, a host computer (main system computer) 62 is, for example, a work station having a graphic user interface (GUI). The host computer functions as a user interface as well as a controller to control an overall operation of the test system. The host computer 62 and the inner hardware of the test system are connected through the system bus 64 (FIGS. 5 and 7).

The event based test system of the present invention does not need the pattern generator and the timing generator used in the conventional semiconductor test system configured by the cycle based concept. Therefore, it is possible to substantially decrease the physical size of the overall test system by installing all of the modular event testers in the test head (or tester main frame) 124.

FIG. 5 is a block diagram showing an example of configuration in the event tester board 66 in the tester module. The further detailed description regarding the event based test system is given in the above U.S. patent application Ser. No. 09/406,300, now U.S. Pat. No. 6,532,561 as well as U.S. patent application Ser. No. 09/259,401, now U.S. Pat. No. 6,360,343 owned by the same assignee of this invention.

The interface 53 and the processor (CPU) 67 are connected to the tester processor (host computer) 62 through the system bus 64. The interface 53 is used, for example, for transferring data from the host computer 62 to a register (not shown) in the event tester board to assign the event testers to the input/output pins of the device under test. For example, when the host computer sends a group assigning address to the system bus 64, the interface 53 interprets the group assigning address and allows the data from the host computer to be stored in the register in the specified event tester board.

The controller 67 is provided, for example, in each event tester board, and controls the operations in the event tester board including generation of events (test patterns), evaluation of output signals from the device under test, and acquisition of failure data. The controller 67 can be provided at each tester board or every several tester boards. Further, the controller 67 may not always necessarily be provided in the event tester board, but the same control functions can be made directly by the host computer 62 to the event tester boards.

An address controller 58 is, for example, in the simplest case, a program counter. The address controller 58 controls the address supplied to the failure data memory 57 and the event memory 60. The event timing data is transferred to the event memory 60 from the host computer as a test program and stored therein.

The event memory 60 stores the event timing data as noted above which defines timing of each of the events (change points from "1" to "0" and from "0" to "1"). For example, the event timing data is stored as two types of data, one of which shows integer multiples of a reference clock cycle while the other shows fractions of the reference clock cycle. Preferably, the event timing data is compressed before being stored in the event memory 60.

A decompression unit 62 decompresses (reproduces) the compressed timing data from the event memory 60. A timing count/scaling logic 63 produces time length data of each event by summing or modifying the event timing data. The time length data expresses the timing of each event by a time length (delay time) from a predetermined reference point.

Figure 1:
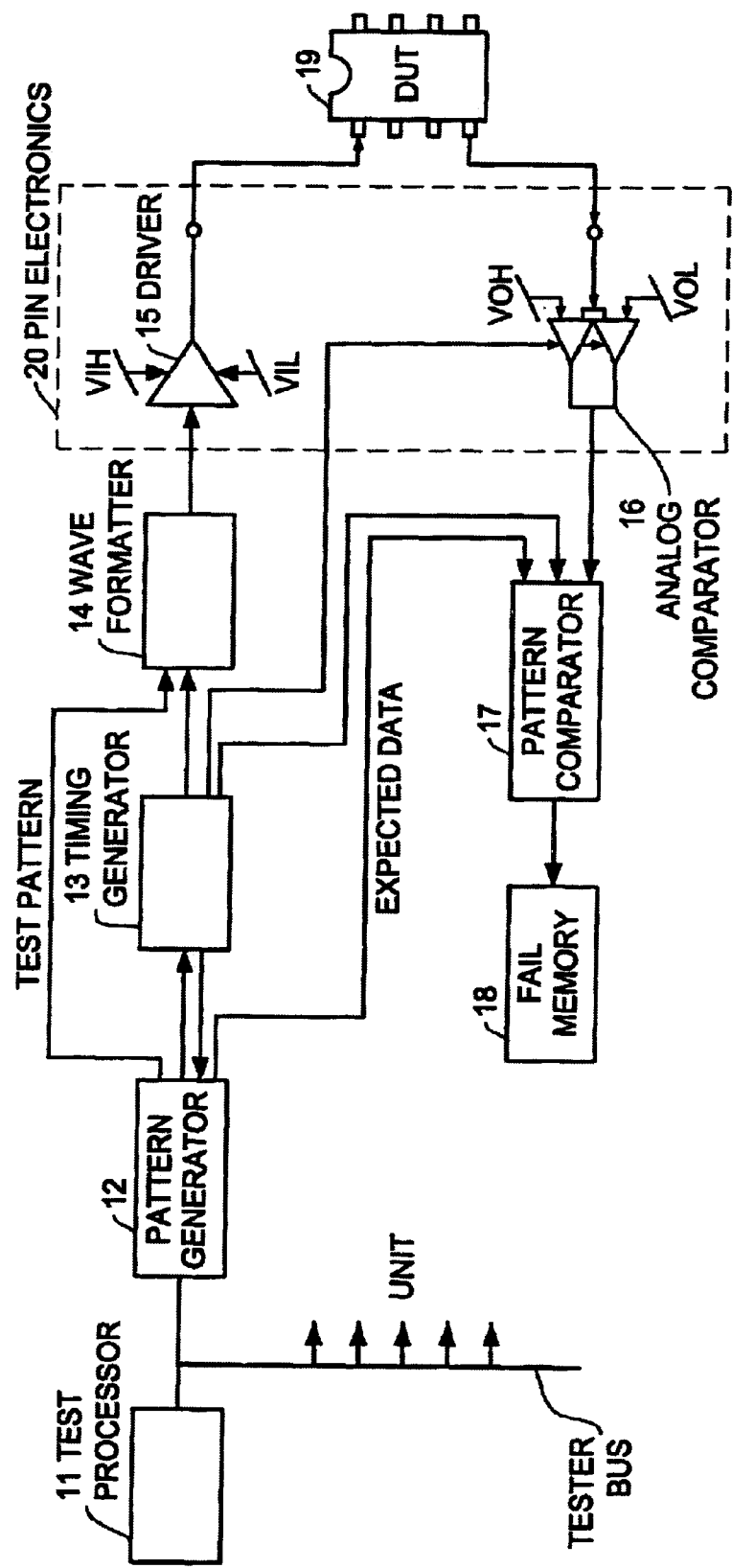
FIG. 1 is a block diagram showing a basic configuration of a semiconductor test system (LSI tester) in the conventional technology.
Figure 2:
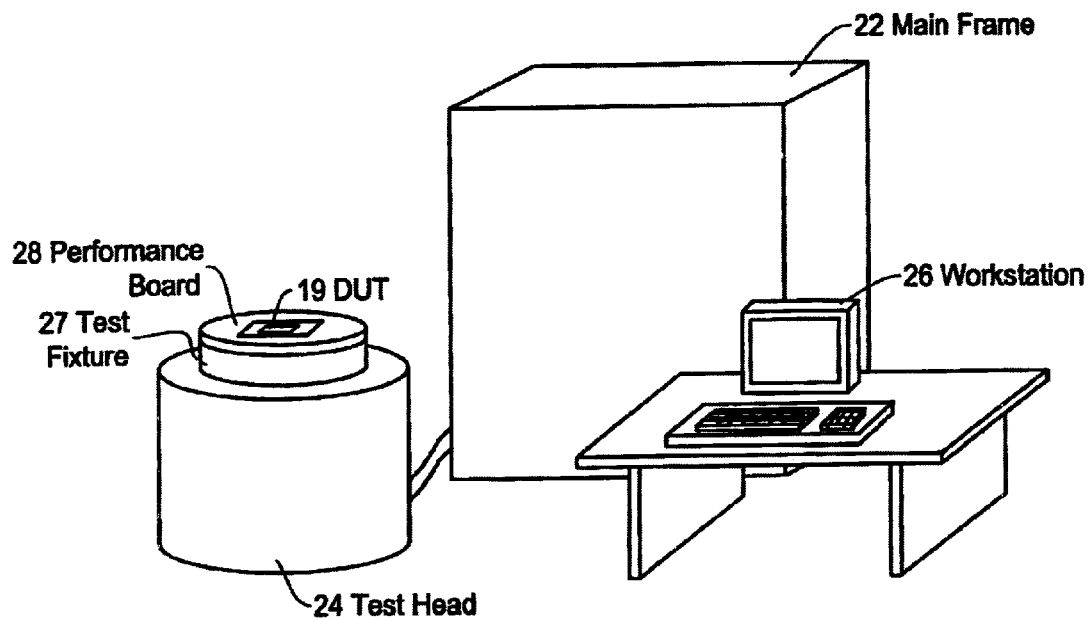
FIG. 2 is a schematic diagram showing an example of outward appearance of a semiconductor test system in the conventional technology.
Figure 3:
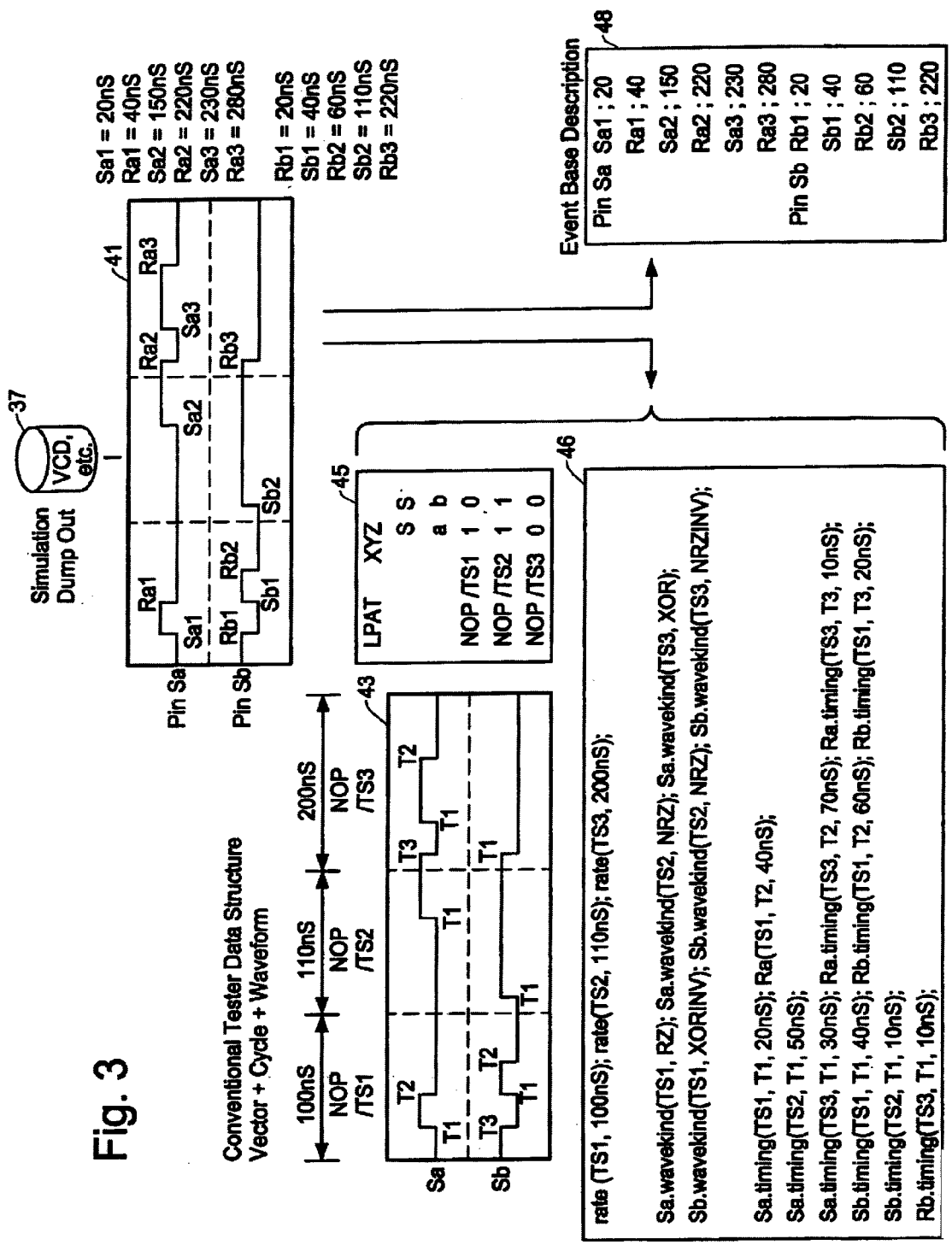
FIG. 3 is a diagram for comparing an example of descriptions for producing a cycle based test pattern in the conventional semiconductor test system with an example of descriptions for producing an event based test pattern in the semiconductor test system of the present invention.

An event generator 64 produces a test pattern based on the time length data and provides the test pattern to the device under test 19 through a pin electronics 61. Thus, particular pins of the device under test 19 are tested by evaluating the response output therefrom. The pin electronics 61 is mainly formed with, as shown in the conventional technology of FIG. 1, a driver which drives the test pattern to be applied to the particular device pin and an analog comparator which determines a voltage level of an output signal of a device pin resulted from application of the test pattern.

In the event tester summarized above, the input signal applied to the device under test and the expected signal compared with the output signal of the device under test are produced by the data in the event based format. In the event based format, the information on the change points in the test signal and expected signal is formed of action information (set and/or reset) and time information (time length from a specified point).

As noted above, in the conventional semiconductor test system, the cycle based method has been used, which requires memory capacity smaller than that required in the event based architecture. In the cycle based test system, the time information of the input signal and expected signal is formed of cycle information (rate or synchronous signal) and delay time information. The action information of the input signal and expected signal is formed of waveform mode data and pattern data. In this arrangement, the delay time information can be defined only by the limited number of data. Further, to generate the pattern data with flexibility, the test program must includes many loops and/or subroutines therein. Therefore, the conventional test system requires complicated structures and operational procedures.

In the event based test system, such complicated structures and operational procedures of the conventional cycle based test system are unnecessary, thereby easily increasing the number of test pins and/or incorporating the test pins of different performances in the same test system. Although the event based test system requires a memory of large capacity, such an increase in the memory capacity is not a major problem since the increase in the memory density and the decrease in the memory cost are rapidly and continuously realized today.

FIG. 7 shows an example of situation where the semiconductor test system of the present invention is applied to testing a system-on-a-chip. In this test system, a plurality of tester modules are assigned to corresponding functional cores in the system-on-a-chip so as to evaluate each functional core, interface between the cores, and the system-on-a-chip as a whole.

As noted above, in many cases in testing a high speed semiconductor device, only a small number of device pins require high speed and high timing accuracy test signals while other device pins are sufficient to be tested by low speed and low timing accuracy test signals. The present invention is suitable for such an actual situation in the device testing and is able to test the device with low cost, high performance and thus with high efficiency.

The configuration of the present invention is also suitable for testing recent semiconductor devices having a built-in self test (BIST) function therein. Such a semiconductor device having the BIST function includes a BIST controller which interfaces with the inner circuits with an external tester when testing the inner circuits. As specified in IEEE-1149.1 (boundary scan TAP controller), the communication between the BIST controller and the tester is made through an interface formed of five pins. The interface requires a high speed operation. Thus, in the example of FIG. 7, a test module for this purpose is denoted by an interface pin group (IPG) module.

In the example of FIG. 7, a tester module $66_1$ is a low speed module (LSM), a tester module $66_2$ is a high speed module (HSM), a tester module $66_3$ is a BIST interface module (IPG), and tester modules $66_4$ and $66_5$ are low speed modules. In this example, it is assumed that a microprocessor core in the system-on-a-chip needs a high speed test and a functional core corresponding to the tester module $66_3$ has the BIST function. The number of pins for each tester module 66 is assigned depending on the pins of the devices under test (functional cores). Such assignment of pin numbers can be varied by the instructions from the host computer.

In evaluating the system-on-a-chip in the arrangement of FIG. 7, rather than evaluating the system-on-a-chip directly, each silicon IC prepared corresponding to each functional core is tested by the corresponding tester module. The main system (host) computer 62 provides test bench data produce in the design stage of the system-on-a-chip to each of the tester modules through the system bus 64. Based on the test bench data, test patterns are generated by the tester modules. The more detailed description regarding the evaluation of the system-on-a-chip functional is given in the U.S. application Ser. No. 09/428,746 owned by the same assignee of this invention.

Figure 8A:
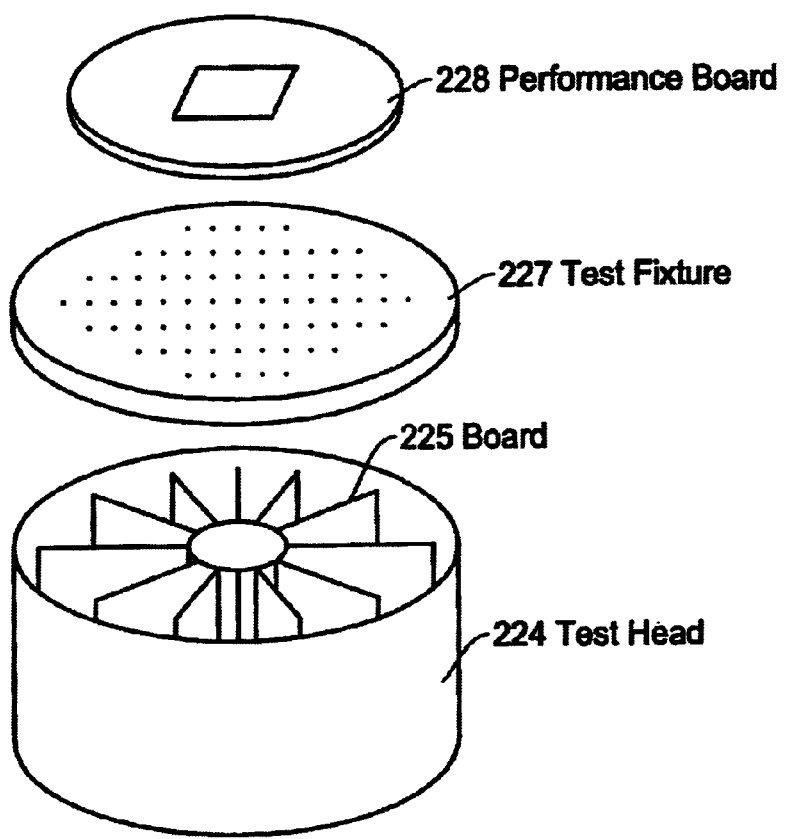
FIGS. 8A and 8B are schematic diagram showing examples of positioning the tester boards of different test performances in the test head depending on the level of test performance.
Figure 8B:
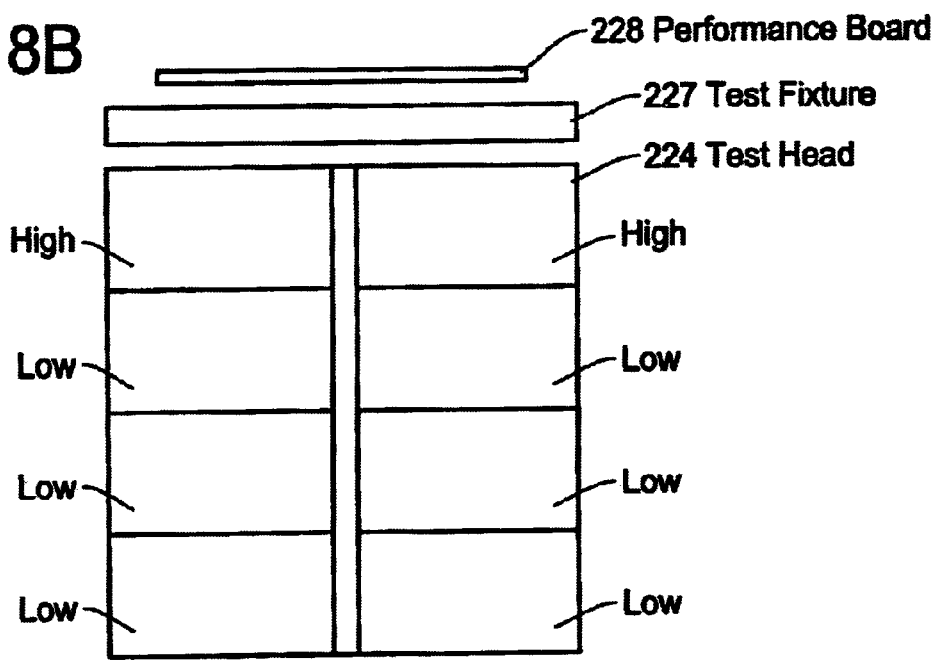

FIGS. 8A and 8B are schematic diagrams showing a second aspect of the present invention. This drawing shows an example of layout of printed circuit boards (tester modules) 225 in a test head 224 of the semiconductor test system. For the high speed and high timing accuracy tester module (or tester board), it is necessary to minimize the signal path length between the tester module and the device under test. On the other hand, for the low speed and low timing accuracy tester module, relatively long signal paths to the device under test are allowable.

Therefore, as shown in FIGS. 8A and 8B, the high speed tester modules or high speed tester boards are arranged in the upper position of the test head 224 while the low speed tester modules are arranged in the lower position of the test head 224. Under this arrangement, the signal path lengths between the high speed tester modules and the device under test through a test fixture 227 can be shortened, thereby achieving high speed test operations.

In the second aspect of the present invention, the positions for mounting the tester modules or boards in the system are determined depending on the operating speeds as noted above. In this example, unlike the first aspect thereof where the tester modules are freely combined in the system, the positions of the tester boards cannot be freely changed. This is because the positions of the tester boards are fixedly determined on the basis of the operating speed of the tester boards. However, in the second aspect of the present invention, a test system of desired performance can be created with low cost.

As has been in the foregoing, since the semiconductor test system of the present invention has a modular structure, a desired test system can be formed freely depending on the kind of devices to be tested and the purpose of the test. In the case where the device under test is a high speed logic IC, only a small portion of the logic circuits therein actually operate in the high speed. Thus, for testing such a high speed logic IC, a small number of tester pins have to have high speed capability. Thus, in the present invention, by combining a large number of low speed tester modules with a small number of high speed tester modules, a high speed tester can be achieved with low cost.

Further, in the semiconductor test system of the present invention, the tester module (tester board) is configured by event based architecture where all the information required for executing the test is prepared in the event based format. Therefore, the rate signal showing the start timing of each test cycle or the pattern generator which operates in synchronism with the rate signal used in the conventional technology are no longer necessary. Because it is not necessary to include the rate signal or pattern generator, each test pin in the event based test system can operate independently from the other test pins. Further, because of the event based architecture, the hardware of the event based test system can be dramatically reduced while the software for controlling the tester modules can be dramatically simplified. Accordingly, an overall physical size of the event based test system can be reduced, resulting in further cost reduction, floor space reduction and associated cost savings.

Further in the semiconductor test system of the present invention, the logic simulation data in the design stage of the device in the electronic design automation (EDA) environment can be directly used to produce the test pattern to test the device in the evaluation stage. Thus, a turnaround time between the design of the device and the evaluation of the device can be substantially decreased, thereby further decreasing the test cost while increasing the test efficiency.

What is claimed is:

1. A semiconductor test system, comprising:
   a test head for accommodating two or more tester modules having different performances;
   means provided on the test head for electrically connecting the tester modules and a device under test; and
   a host computer for controlling an overall operation of the test system by communicating with the tester modules through a tester bus.

2. A semiconductor test system as defined in claim 1, wherein one type of the performances of the tester module is high speed high timing accuracy while other type of performance is low speed low timing accuracy.

3. A semiconductor test system as defined in claim 2, wherein, within the test head, the tester module of the high speed high timing accuracy is positioned closer to the connecting means than the tester module of the low speed low timing accuracy.

4. A semiconductor test system as defined in claim 1, wherein specification for connecting the tester modules and the means for electrically connecting the tester modules and the device under test is standardized.

5. A semiconductor test system as defined in claim 4, wherein, within the test head, the tester module of the high speed high timing accuracy is positioned closer to the connecting means than the tester module of the low speed low timing accuracy.

6. A semiconductor test system as defined in claim 1, wherein the means for electrically connecting the tester modules and the device under test is comprised of a performance board having a mechanism for mounting the device under test thereon and a test fixture having a connection mechanism for electrically connecting between the performance board and the tester modules.

7. A semiconductor test system as defined in claim 1, wherein a number of tester pins is variably assigned to the tester module.

8. A semiconductor test system as defined in claim 1, wherein a number of tester pins is variably assigned to the tester module, and such assignment of test pins and modification thereof are regulated by address data from the host computer.

9. A semiconductor test system as defined in claim 1, wherein each of the tester modules includes a plurality of event tester boards where each of the event tester boards is assigned to a predetermined number of test pins.

10. A semiconductor test system as defined in claim 9, wherein each of the tester modules corresponds to one of the event tester boards.

11. A semiconductor test system as defined in claim 9, wherein each of the tester modules includes a plurality of event tester boards wherein each of the event tester boards includes an inner controller where the inner controller controls, in response to instructions from the host computer, to generate a test pattern from the tester module and to evaluate an output signal of the device under test.

12. A semiconductor test system as defined in claim 1, wherein each of the tester modules includes an inner controller where the inner controller controls, in response to instructions from the host computer, to generate a test pattern from the tester module and to evaluate an output signal of the device under test.

13. A semiconductor test system as defined in claim 1, wherein the device under test has a BIST (built-in self test) function, and the tester module which communicates with a BIST controller in the device under test is configured to generate signals defined in IEEE 1149 standard.

14. A semiconductor test system as defined in claim 1, wherein each of the tester modules includes a plurality of event tester boards where each of the event tester boards is assigned to one test pin, wherein each of the event tester boards is comprised of:
    a controller which controls, in response to instructions from the host computer, to generate the test pattern from the tester module and to evaluate an output signal of the device under test;
    an event memory for storing timing data for each event;
    an address sequencer for providing, under the control of the controller, address data to the event memory;
    means for producing a test pattern based on the timing data from the event memory; and
    a pin electronics for transferring the test pattern to a corresponding pin of the device under test and receiving a response output signal from the device under test.

* * * * *